United States Patent [19]

Symanski

[11] 4,015,252

[45] Mar. 29, 1977

[54] HIGH SPEED SERIAL DATA SYNCHRONIZATION SCHEME

[75] Inventor: Jerome J. Symanski, San Diego, Calif.

[73] Assignee: The United States of America as represented by the Secretary of the Navy, Washington, D.C.

[22] Filed: June 25, 1975

[21] Appl. No.: 590,005

[52] U.S. Cl. .................................. 340/347 DD
[51] Int. Cl.² ................................ G06F 5/04
[58] Field of Search ............ 340/347 DD; 235/154; 178/26, 69.5 R; 328/55, 56

[56] References Cited
UNITED STATES PATENTS

| | | | |
|---|---|---|---|
| 2,635,229 | 4/1953 | Gloess | 340/347 DD |
| 2,827,233 | 3/1958 | Johnson | 340/347 DD |
| 3,160,876 | 12/1964 | Stochel | 340/347 DD |
| 3,182,306 | 5/1965 | Bartlett | 340/347 DD |
| 3,226,709 | 12/1965 | Brightman | 340/347 DD |
| 3,261,913 | 7/1966 | Reichert | 340/347 DD |
| 3,492,422 | 1/1970 | Mason | 340/347 DD |
| 3,792,362 | 2/1974 | Grant | 328/55 |

*Primary Examiner*—Charles D. Miller
*Attorney, Agent, or Firm*—R. S. Sciascia; G. J. Rubens; H. Fendelman

[57] ABSTRACT

A serial-to-parallel data conversion and synchronization scheme in which a plurality of active logic elements are utilized as delay lines. Each of the delay lines introduces a delay equal to the period of one data bit and one additional delay line introduces a delay equal to one half the period of a data bit. The input of the first delay line is connected to the data input of a first flip-flop and the outputs of each of the plurality of delay lines are each connected to the data input of a flip-flop. The output of the additional delay line is connected to the clock inputs of each of the flip-flops whereby the serial data word is converted to a parallel data word and the conversion is internally clocked by the delay lines themselves.

6 Claims, 3 Drawing Figures

HIGH SPEED SERIAL DATA SYNCHRONIZATION SCHEME

BACKGROUND OF THE INVENTION

There are several known schemes to synchronize on serial data streams of the order of 20 megahertz, but they all have drawbacks. A few of such schemes are: encoding of the serial data stream, such as Miller code, Manchester code, Bi-phase, Return to Zero (RZ), etc.; countdown, using a higher frequency clock and strobing the serial stream to lock-on to a sync bit; and delay lines with taps to clock bits.

The encoding of serial data streams is used to a large degree in radio transmission and magnetic recording. The peripheral circuitry often has certain characteristics which make one coding scheme or another particularly desirable. For instance, the Miller code has a power spectrum for a random serial data stream which peaks at threeeighths of the data rate. This is useful in systems which do not work well at low frequencies. Relative to a Non-Return-to-Zero (NRZ) serial stream, which lacks any coding, the Miller code has five times the power density at its peak frequency than does the NRZ serial stream at that frequency. Similarly, the Manchester code requires about twice the bandwidth of NRZ at the same serial bit rate. Hence, for a random binary data stream, NRZ has the lowest bandwidth requirements. If one wishes to put this serial stream through logic circuitry or long coaxial lines, the low bandwidth requirement of NRZ is a major advantage. Other coding schemes such as Bi-phase and Return-to-Zero (RZ) have even higher bandwidth requirements than the Miller code. (A more extensive coverage of the relative merits of coding schemes is given in an article by Charles F. Spitzer, Computer Design, October 1973, page 83, entitled "Digital Magnetic Recording of Wideband Analog Signals".)

In using an NRZ format for a serial data stream, synchronization can be achieved by sampling the data stream at 4, 8 or 16 times the serial bit rate. When it has been established that a group of bits is coming, a countdown network can then be enabled to clock in the data stream at the bit rate. This approach works very well at low bit rates, a few megahertz or less, but runs into problems of noise, power requirements, and cost when one moves into the 20 megahertz bit rate region. In general, it is wise to keep frequencies low when dealing with silicon integrated logic circuits. The use of the high frequencies can be the cause of many subtle problems.

The state-of-the-art in delay lines has progressed to the point where 50 nanosecond delays can be packaged in sizes very similar and compatible with integrated logic circuits. These delay lines have bandwidths on the order of 50 megahertz which make them useful for certain applications, but the cost is high. Further, use of these delay lines requires additional buffering circuits which complicates design and increases the size of the device.

The factors mentioned attributable to the different synchronization schemes have different relative importance depending on the particular application. In many cases the individual factors of size, bandwidth, cost, power, bit rate, and complexity, etc. may not be important or may be weighed differently.

SUMMARY OF THE INVENTION

The present invention relates to a serial-to-parallel data conversion and synchronization scheme particularly suitable for applications in which all of the above enumerated factors are important consideration. It lends itself readily to low cost manufacturing, low power requirements, small size, simplicity and reliability in synchronizing on high speed, i.e., 5 to 25 megahertz, serial data streams. It is noted that the present invention would typically be used with a formatted control word scheme and appropriate control logic for further synchronizing the transmission and reception of the data. For instance, in communicating between a computer and a peripheral device, two modes of operation, a control mode and a data mode might be utilized. In the control mode, a control word might include a predetermined format of synchronization bits and information bits for indicating, for example, the computer's status regarding its readiness to receive or send data. Once a data transmission is indicated, binary data would be serially transmitted in a data word including a predetermined format of data bits and synchronization bits. This serial data word would then be received by the serial-to-parallel synchronization and conversion unit of the present invention which, pursuant to the appearance of its own self generated clocking signal, would output the data in a parallel format. This parallel data can then be used for various logic operations.

While this serial-to-parallel synchronization and conversion might also be achieved with lumped-constant (LC) delay lines, the state-of-the art of LC delay lines will not allow the fast rise and fall times, the small size, or the low cost of the integrated circuit delay lines described herein. A further advantage of the integrated circuit technique of the present invention is that the delay line can be "tuned" for various frequencies simply by connecting the supply voltage of the integrated circuit to a variable voltage source. This could be accomplished by merely connecting a small variable or fixed resistor between a fixed power supply and the power bias pin of the integrated circuits utilized in the delay line of the present invention. A 20–30 percent frequency variation could readily be accomplished thereby.

STATEMENT OF THE OBJECTS OF THE INVENTION

It is the primary object of the present invention to disclose a novel serial-to-parallel data synchronization and conversion scheme particularly suitable for applications in which size, bandwidth, cost, power, bit rate and complexity are all important considerations.

It is another object of the present invention to disclose a novel serial-to-parallel data synchronization and conversion scheme requiring no separate clocking line.

Other objects, advantages and novel features of the invention will become apparent from the following detailed description of the invention when considered in conjunction with the accompanying drawings.

DESCRIPTION OF THE PREFERRED EMBODIMENTS

Figure 1:
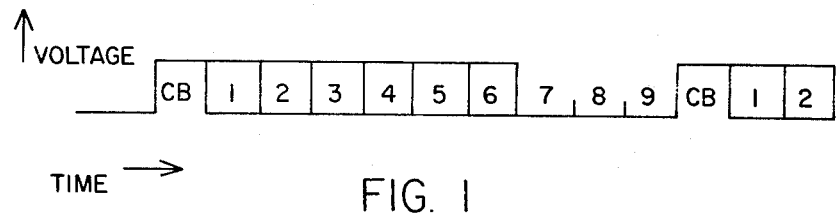
FIG. 1 is a representation of a suitable serial data bit stream format for use in the present invention.

By way of example, a serial data bit stream format suitable for use in the present invention is illustrated in FIG. 1. As illustrated therein, a clock bit, CB, is followed by six data bits and then three binary zeros. Variations in the number of data bits and subsequent zeros are obviously possible but for the sake of concreteness, the 10-bit pattern illustrated has been chosen. The clock bit and binary "1"'s following the data bits are part of an exemplary data synchronization scheme with which the present invention would typically be used.

Figure 2:
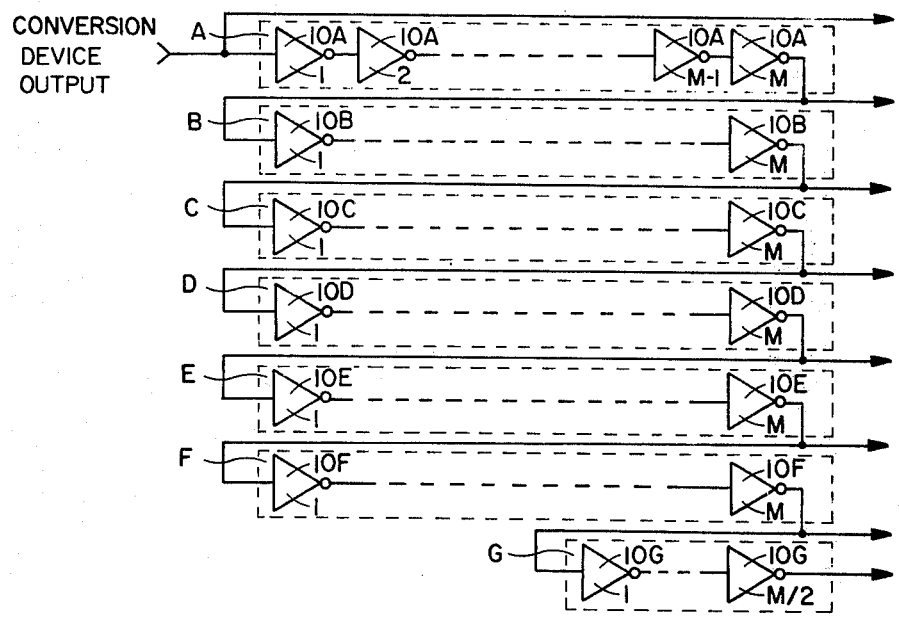
FIG. 2 is a network schematic diagram of the delay lines of the present invention.

This serial data word is sent from the transmitter to the receiver by whatever technique is appropriate, i.e., twisted pair, coaxial cable, fiber optics, etc. At the output of a conversion device (not shown) used for converting from the transmission mode being utilized to the logic being used in the system, typically TTL, there exists a data word in the form of binary digits which is fed into a long string of active logic elements $10_A$, $10_B$, $10_C$, $10_D$, $10_E$, $10_F$, and $10_G$, which form delay sections A, B, C, D, E, F, and G as illustrated in FIG. 2. The term active logic element is used herein to distinguish from passive elements, i.e., elements not requiring their own power supply, and includes within the definition herein only those logic elements not requiring separate clocking. In practice, it has been found that the low power Schottky hex inverters (LSO4) are particularly suitable for this invention but it is to be understood that any other logic devices such as AND and OR gates could be used. In FIG. 2, M is the number of logic devices or delay elements in a section of each string necessary to produce a delay equal to one-bit time, i.e., the period of one data bit. One delay section is needed for each data bit in the data word, six in the present example.

Figure 3:
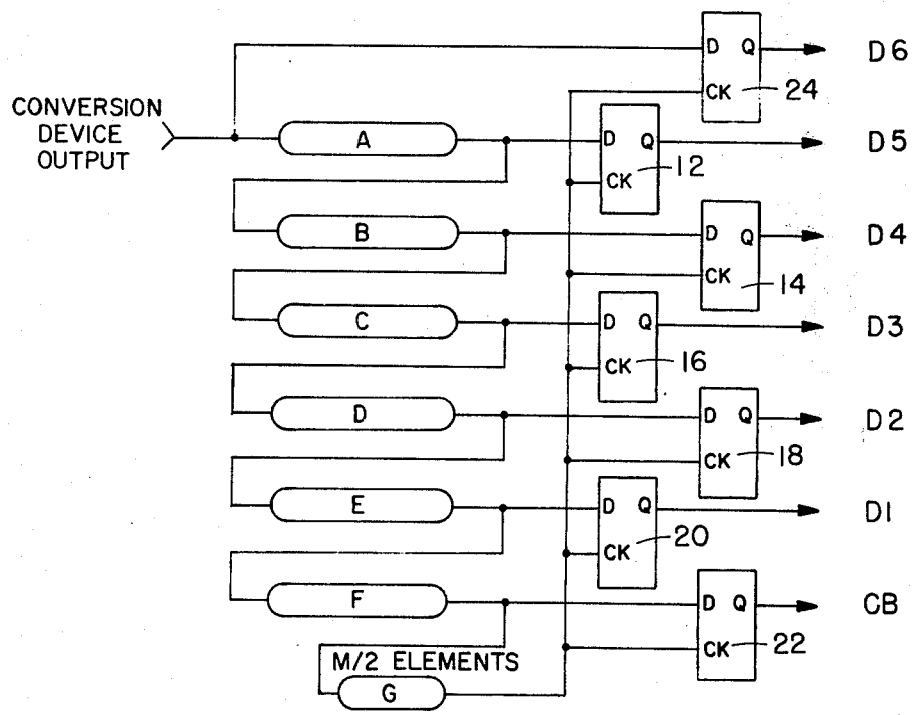
FIG. 3 is a network schematic diagram of the serial-to-parallel synchronization and conversion device of the present invention.

As is illustrated in FIGS. 2 and 3 the $M^{th}$ element of each delay section is connected to the first element of the next section. The $M^{th}$ element of each section is also connected (FIG. 3) to the data input of the flip-flops 12, 14, 16, 18, 20 and 22. One additional flip-flop 24 has its data input connected to the input of the first element $10_A$ in the string of delay elements A. It is noted that in FIG. 3 each string of M elements is represented simply as a delay line.

Ths device operates as follows. Each delay section introduces a delay equal to one bit time, i.e., the period of one data bit. The output of the sixth delay section F is connected to a delay section G which introduces a delay equal to one half the data bit period and the output of this delay section G is used as a clock for each of the flip-flops 12, 14, 16, 18, 20, 22 and 24. It is noted, however, that the delay introduced by section G need only be less than one bit time although the half bit-period delay is more accurate and reliable. It is readily apparent that by the time the trailing edge of the clock bit CB has propagated through the six delay sections the leading edge of the sixth data bit will be present at the input to the first delay section. Thus, after the clock bit has undergone the additional delay introduced by delay section G the middle of the sixth data bit will be present at the input to delay section A and the middle of each of the other five data bits will be present at the output of each of the delay sections A, B, C, D, and E. The output from delay section G will clock each of the flip-flops and the serial data bits D1, . . . , D6 will be present at the output of the flip-flops in parallel format.

Thus, a novel device has been disclosed for sampling a data stream and performing a serial-to-parallel conversion. As is evident from the foregoing description, this conversion to parallel of serial asynchronous data has been accomplished without a separate clock line or complex coding of the simple NRZ format. This function could easily be fabricated on one silicon chip. Other logic families such as emitter coupled logic (ECL) and complimentary metal oxide semiconductor logic (CMOS) could also be used. The serial data bit rate for different logic families would, of course, vary depending on the propagation delay of the inverter stage. Noninverting buffers could also be used instead of the inverters illustrated to create the correct delay for a particular bit rate. The stages of the delay line could be further adjusted by using capacitors or small inductors between stages. Temperature compensation could be achieved by logically changing the elements in the section or varying the bias potential as applied to the delay elements.

Obviously many modifications and variations of the present invention are possible in the light of the above teachings. It is therefore to be understood that within the scope of the appended claims the invention may be practiced otherwise than as specifically described.

What is claimed is:

1. A device for synchronizing and converting a serial data bit stream to a parallel data format comprising:
    a serially connected plurality of strings of active logic devices, each said string of active logic devices introducing a delay equal to the period of one said data bit:
    one additional string of active logic devices having an input serially connected to said plurality of strings and an output, introducing a delay less than the period of one said data bit;
    a plurality of flip-flops each having data and clock inputs and an output, each data input being connected to one end of one of said plurality of strings of active logic devices and each clock input being connected to said output of said one additional string.

2. The device of claim 1 wherein each of said active logic devices is a buffer.

3. The device of claim 1 wherein each of said active logic devices is an inverter.

4. A device for synchronizing and converting a serial data word of N bits to a parallel data N-bit word comprising:
    N serially connected delay lines, each said delay line introducing a delay equal to the period of one said data bit;
    a plurality of flip-flops each having a data input connected to the output of one of said delay lines and also having a clock input;
    one additional delay line serially connected to said plurality of delay lines, introducing a delay less than the period of one said data bit and having an output connected to the clock input of each of said plurality of flip-flops.

5. The device of claim 4 further comprising:
    one additional flip-flop having a data input connected to the input of one of said N delay lines and clock input connected to said one additional delay line output.

6. The device of claim 5 wherein each of said delay lines comprises a plurality of active logic devices.

* * * * *